United States Patent [19]

Nakamura et al.

[11] Patent Number: 4,640,887
[45] Date of Patent: Feb. 3, 1987

[54] PHOTOSENSITIVE IMAGE-FORMING MATERIAL COMPRISED OF CARBOXYL GROUPS DEVELOPABLE IN AQUEOUS ALKALINE BASE SOLUTIONS

[75] Inventors: Chiaki Nakamura, Tokyo; Koji Oe; Tomonobu Muta, both of Urawa; Toshiki Sasaki, Kamifukuoka; Yoshihiro Nishio, Ohmiya, all of Japan

[73] Assignee: Dainippon Ink and Chemicals, Inc., Tokyo, Japan

[21] Appl. No.: 699,547

[22] Filed: Feb. 8, 1985

[30] Foreign Application Priority Data

Feb. 9, 1984 [JP] Japan .................................. 59-20739
Mar. 13, 1984 [JP] Japan .................................. 59-46429

[51] Int. Cl.⁴ .................... G03C 1/71; G03C 1/94; C08G 63/18
[52] U.S. Cl. .................... 430/275; 430/285; 430/286; 430/287; 430/284; 428/458; 428/913; 522/90; 522/98; 522/101; 522/104; 525/444; 528/296
[58] Field of Search .............. 430/285, 286, 287, 275, 430/284; 525/444; 528/296; 204/159.19; 522/90, 98, 101, 104; 428/458, 913

[56] References Cited

U.S. PATENT DOCUMENTS

| | | | |
|---|---|---|---|
| 3,677,920 | 7/1972 | Kai et al. ................ | 430/285 X |
| 3,726,685 | 4/1973 | Phlipot et al. ................ | 522/104 |
| 3,923,523 | 12/1975 | Nishikubo et al. ................ | 430/285 |
| 3,929,489 | 12/1975 | Arcesi et al. ................ | 204/159.19 X |
| 4,258,124 | 3/1981 | Shimizu et al. ................ | 522/104 X |
| 4,421,841 | 12/1983 | Shimizu et al. ................ | 430/285 |
| 4,591,545 | 5/1986 | Nakamura et al. ................ | 528/296 X |

FOREIGN PATENT DOCUMENTS

| | | | |
|---|---|---|---|
| 52-130897 | 4/1977 | Japan . | |
| 206431 | 11/1984 | Japan ................ | 430/285 |
| 856917 | 12/1960 | United Kingdom ................ | 528/296 |

*Primary Examiner*—John E. Kittle
*Assistant Examiner*—Cynthia Hamilton
*Attorney, Agent, or Firm*—Sherman and Shalloway

[57] ABSTRACT

A photosensitive image-forming material developable with aqueous alkali developers, which is characterized in that the photosensitive resin having the structural units represented by the general formula

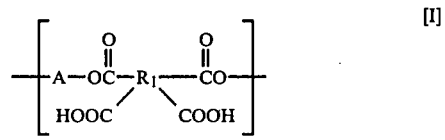

(wherein A represents a linear polyester structural unit containing in its main chain the dicarboxylic acid unit having a photosensitive, unsaturated double bond adjacent to the aromatic ring, and $R_1$ represents a tetravalent organic group) is contained in the photosensitive layer.

20 Claims, No Drawings

PHOTOSENSITIVE IMAGE-FORMING MATERIAL COMPRISED OF CARBOXYL GROUPS DEVELOPABLE IN AQUEOUS ALKALINE BASE SOLUTIONS

This invention relates to a photosensitive image-forming material. More specifically, the invention relates to a photosensitive image-forming material which is developable with aqueous, alkaline developers, has sufficient photosensitivity, and when used as a printing plate, exhibits excellent printing durability and oleophilicity.

Because the moiety expressed by the formula,

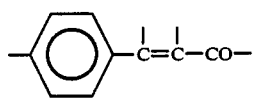

(hereinafter will be referred to as "cinnamoyl moiety") shows unique photo-dimerization reaction, various photosensitive resins having introduced into their side chains or main chains the cinnamoyl moiety have heretofore been studied. For example, polyvinyl alcohol, polyepichlorohydrin, polystyrene, acrylic resins and epoxy resins, etc., containing the cinnamoyl moiety in their side chains; and polyesters and polyamides containing the cinnamoyl moiety in their main chains, have been proposed and some of them was already reduced to practice. That is, the polyvinyl cinnamate prepared by the reaction of polyvinyl alcohol and cinnamoyl chloride, the polyesters prepared by the condensation of diethyl phenylenediacrylate with 1,4-di-$\beta$-hydroxyethoxycyclohexane, etc., are utilized as the image-forming material for printing plates, LSI elements, etc.

Of the aforesaid photo-dimerization type photosensitive resins, the photosensitive polyester resins having the cinnamoyl moiety in their molecular main chains, which are prepared by the condensation of phenylenediacrylic acid or alkyl esters thereof with glycol, are regarded to have relatively high photosensitivity.

However, these photosensitive resins exhibit solubility only in organic solvents, and therefore organic solvents are used as the developer for developing the photosensitive layer made of these resins. Use of organic solvents as a developer is subject to many problems, such as the developing processibility, safety and hygienic conditions of working environment, economy and prevention of environmental pollution, e.g. atmospheric pollution. Also because organic solvents are more expensive than aqueous developers, development of photosensitive resins developable with aqueous developers have been in keen demand.

As such resins, recently a photosensitive resin containing in its main chain phenylenediacrylate group or cinnamoyloxy group, and sulfonate salt group adjacent to the aromatic ring has been proposed (Japan Laid-open Patent Applications, Publication Nos. 18625/83, 130897/77, etc.). These conventional resins can be developed with aqueous developers when used as the photosensitive material of printing plate, but still have such defects as that the plate becomes tacky upon absorbing moisture in the air and that the oleophilicity and printing durability at the printing time are inferior, and their improvement in those aspects is desired.

Accordingly, an object of the present invention is to provide an image-forming material developable with aqueous, alkaline developers.

Another object of the present invention is to provide a photosensitive, image-forming material which shows sufficient photosensitivity, printing durability and oleophilicity, when used as the photosensitive material of printing plate.

The above objects of the present invention are achieved by a photosensitive, image-forming material which is characterized in that a photosensitive resin composed of the structural units expressed by the general formula,

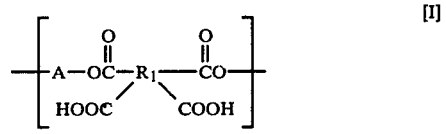

(wherein A represents a linear polyester structural unit containing in its main chain the dicarboxylic acid unit having a photosensitive, unsaturated double bond adjacent to the aromatic ring, and R represents a tetravalent organic group) is contained in the photosensitive layer.

The photosensitive resin to be used in the present invention can be prepared, for example, by preparing a linear polyester composed of the dicarboxylic acid units having photosensitive, unsaturated double bond adjacent to the aromatic ring (hereinafter simply "photosensitive unsaturated dicarboxylic acid") and glycol units and which has at its terminal hydroxyl groups, (such polyester will be hereinafter referred to as "the linear polyester"), and reacting said polyester with an acid anhydride. (This method will be hereinafter referred to as "the acid anhydride method").

The photosensitive unsaturated dicarboxylic acid unit to be used in the above acid anhydride method can be derived, for example, from the dicarboxylic acids or their derivatives of the general formulae (1)–(7) below. Examples of useful derivatives include dialkyl esters such as dimethyl or diethyl esters of these dicarboxylic acids; di(alkylene glycol)esters such as di(ethylene glycol) or di(propylene glycol)esters; and dicarboxylic acid halides such as dicarboxylic acid chloride.

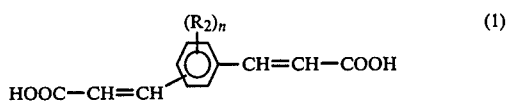

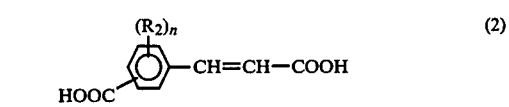

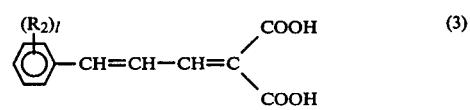

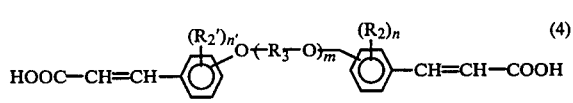

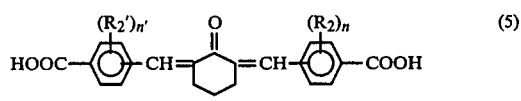

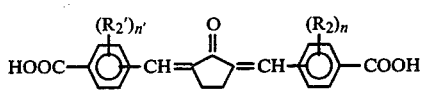

(6)

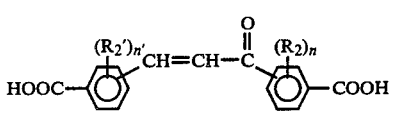

(7)

In the above general formulae (1) through (7), $R_2$ and $R_2'$ represent hydrogen atom, $C_1$–$C_4$ alkyl groups, $C_1$–$C_4$ alkoxyl groups, halogen atoms or nitro group independently from each other; $R_3$ represents $C_2$–$C_4$ alkylene groups; l is an integer of 1–5; n and n' each independently stands for an integer of 1–4; and m is an integer of 1–5.

Preferred specific example of above dicarboxylic acids and their derivatives include; p-phenylenediacrylic acid, m-phenylenediacrylic acid, 2,5-dimethoxy-p-phenylenediacrylic acid, 2-nitro-p-phenylenediacrylic acid, p-carboxycinnamic acid, cinnamylidenemalonic acid, bis(p-cinnamic acid) diethylene glycol ether, bis(p-carboxybenzal)cyclohexanone, bis(p-carboxybenzal)cyclopentanone, p,p'-chalconedicarboxylic acid, etc.

In the preparation of the linear polyester other polyvalent carboxylic acids or their derivatives may be used concurrently with the above photosensitive unsaturated dicarboxylic acids or their derivatives. Examples of such co-usable compounds include: dicarboxylic acids such as succinic acid, adipic acid, azelaic acid, sebacic acid, phthalic acid, isophthalic acid, terephthalic acid, tetrahydrophthalic acid, hexahydrophthalic acid, tetrabromophthalic acid, tetrachlorophthalic acid, 1,4-cyclohexanedicarboxylic acid, maleic acid, fumaric acid, itaconic acid and 5-sodiumsulfoisophthalic acid; and their anhydrides and ester derivatives.

However, use of these other dicarboxylic acids or their derivatives in large amounts should be avoided, because such will induce reduction in photosensitivity of the resin. In order to obtain sufficiently high photosensitivity, it is desirable that the photosensitive unsaturated dicarboxylic acid unit content should be 30–100 mol % based on the total dicarboxylic acid units in the linear polyester.

Glycol units can be derived from various compounds, with no particular limitation. For example, ethylene glycol, diethylene glycol, triethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, and propylene oxide adduct of hydrogenated bisphenol A, etc. can be used.

In the synthesis of linear polyester composed of the dicarboxylic acid units including those derived from the photosensitive unsaturated dicarboxylic acids, and glycol units, and having hydroxyl groups, it is desirable to select the quantitative ratio of the starting materials so as to obtain a linear polyester having hydroxyl groups at both terminal of its molecule, i.e., per one equivalent of the group derived from the carboxylic acid such as carboxyl or ester group, at least one equivalent, preferably 1.1–2.0 equivalents, of the hydroxyl group of glycol should be provided.

The linear polyester can be easily synthesized by the means known in the field of ordinary polyester synthesis, i.e., through the reaction (esterification or transesterification reaction) of above dicarboxylic acid component and glycol component charged in the reactor at the predetermined quantitative ratio, if necessary in the presence of a catalyst and an inhibitor. Preferred reaction temperature ranges 150°–250° C. If a relatively low molecular weight glycol is used, the reaction is performed using more of the glycol component than the predetermined quantity, the excessive glycol being distilled off after completion of the reaction, by gradually reducing the pressure in the reactor. The preferred reaction temperature in this case is 150°–250° C., and the pressure is preferably reduced to no higher than 3 mmHg.

Examples of the catalysts which may be used in the linear polyester production include such organometallic compounds as tetraisopropyl titanate, tetrabutoxytitanate, dibutyltin oxide, dibutyltin laurate, lithium ethoxide, zinc acetate, manganese acetate, calcium acetate, etc.; and inorganometallic compounds such as titanium dioxide, antimony trioxide, calcium oxide, zinc chloride, etc. The amount of the catalyst preferably is 50–10,000 ppm as the metallic component.

The inhibitor is used to inhibit as much as possible the crosslinking and branching of ethylenic unsaturated groups which is apt to take place concurrently with the polycondensation reaction. For example, phenothiazine, hydroquinone, hydroquinone monomethyl ether, 2,6-di-tert.-butyl-p-cresol, p-benzoquinone, etc. may be used for this purpose. Its amount of use is preferably 50–2,000 ppm.

Of the linear polyesters thus produced, those having the hydroxyl value of 15–360 are preferred. When the hydroxyl value is less than 15, the image-forming material becomes difficult to be developed with aqueous solutions, and if it is more than 360, sufficient sensitivity is hardly obtainable.

Examples of the acid anhydrides useful in the acid anhydride method include: aromatic tetracarboxylic dianhydrides such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphosphoryldiphenylene)-bis-(iminocarbonyl)]diphthalic dianhydride, hydroquinonediacetate-trimellitic anhydride adduct, diacetyldiamine-trimellitic anhydride adduct, etc.; alicyclic tetracarboxylic dianhydrides such as 5-(2,5-dioxotetrahydrofuryl)-3-methyl-3-cyclohexene-1, 2-dicarboxylic anhydride (Epichron B-4400, product of Dainippon Ink and Chemicals, Inc,) 1,2,3,4-cyclopentanetetracarboxylic dianhydride, 1,2,4,5-cyclohexanetetracarboxylic dianhydride, tetrahydrofurantetracarboxylic dianhydride, etc.; and aliphatic tetracarboxylic dianhydrides such as 1,2,3,4-butanetetracarboxylic dianhydride, 1,2,4,5-pentanetetracarboxylic dianhydride, etc.

In the production of the photosensitive resin, the amount of acid anhydride to be used is selected from the range of, per one equivalent of hydroxyl groups in the linear polyester, 0.5–1.5 equivalents of acid anhydride groups in the acid anhydride, preferably 0.7–1.2 equivalents. When the equivalent number of acid anhydride groups per one hydroxyl equivalent in the linear polyester is less than 0.5 or more than 1.5, the resulting photosensitive resin tends to fail to have sufficient photosensitivity.

The reaction of the linear polyester with the acid anhydride may be effected in such systems as: (a) that wherein the predetermined amount of acid anhydride is added to molten linear polyester, or (b) that wherein the linear polyester is dissolved in an organic solvent, to which the predetermined amount of acid anhydride is added. Preferred reaction conditions naturally differ depending on the reactivity of acid anhydride employed, presence of catalyst, etc., but generally speaking, the reaction temperature preferably ranges from room temperature to 250° C. This reaction can be obviously effected by mixing the two by agitation in ordinary reactors in melt or solution state. Besides, in the case (a) above, the two may be mixed in, for example, an extruder. Examples of the organic solvents useful for the above reaction include, chlorine-containing solvents such as methylene chloride, chloroform, trichloroethane, trichloroethylene, chlorobenzene, dichlorobenzene, carbon tetrachloride, etc.; ether-type solvents such as tetrahydrofuran, dioxane, etc.; ester-type solvents such as glycol methyl ether acetate, glycol ethyl ether acetate, ethyl acetate, etc.; ketone-type solvents such as methyl etyl ketone, methyl isobutyl ketone, cyclohexanone, 4-methyl-4-methoxy-2-pentanone, etc.; nitrogen-containing solvents such as dimethylformamide, dimethylacetamide, N-methylpyrrolidone, nitrobenzene, etc.; and dimethylsulfoxide. Those solvents can be used either singly or in combination.

It is also possible to prepare the photosensitive resin by first making a photosensitive polyester by the acid anhydride method, and successively increasing the molecular weight of the polyester using various compounds containing in their molecules at least two functional groups reactable with hydroxyl groups (hereinafter referred to as "chain extending agent"). In that case, it is preferred to react the acid anhydride and the linear polyester at such a ratio that the acid anhydride group in the acid anhydride per one hydroxyl equivalent of the linear polyester should become less than one equivalent, preferably 0.99–0.5 equivalent. Thus obtained photosensitive polyester resin has terminal hydroxyl groups, and is easy to be subsequently highly polymerized with the chain extending agent.

Examples of the functional groups reactable with the terminal hydroxyl groups of the above photosensitive polyester (hereinafter "resin precursor") include: aryl ester, aryl carbonate, N-acyl-lactam, N-acylimide, benzoxazinone, isocyanate, oxazolonyl, N-acylimidazole, silanol, furoxane, aziridine, isothiocyanate, vinylether, keteneacetal, unsaturated cycloacetal and carbodiimide groups, etc.

Examples of the chain extending agent having these functional groups include such compounds as diaryloxalate compounds, diarylphthalate compounds, diarylcarbonate compounds, bis(N-acyl lactam) compounds, bis(N-acylimide) compounds, bisbenzoxazinone compounds, polyisocyanate compounds, bisoxazolone compounds, bis(N-acylimidazole) compounds, alkoxysilane compounds, silanol compounds, furoxane compounds, bisaziridine compounds, polyisothiocyanate compounds, divinylether compounds, diketeneacetal compounds, unsaturated cycloacetal compounds and biscarbodiimide compounds, etc. Specific examples of the diaryloxalate compounds include those expressed by the general formula (8) below; those of diarylphthalate compounds are expressed by the general formula (9) below; and those of diarylcarbonate compounds, by the general formula (10) below.

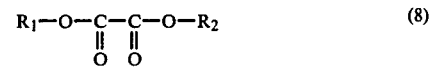

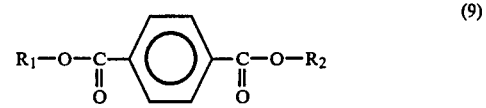

In the above general formulae (8) through (10), $R_1$ and $R_2$ each independently represents optionally substitued aromatic hydrocarbon group. Specific examples of $R_1$ and $R_2$ includes

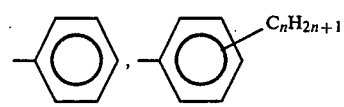

(n is an integer of 1–10),

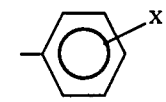

(X is a halogen atom),

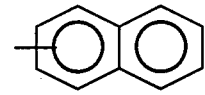

Examples of bis(N-acyllactam) compounds are those expressed by the general formula (11) below, and those of bis(N-acylimide) compounds, expressed by the general formula (12) below.

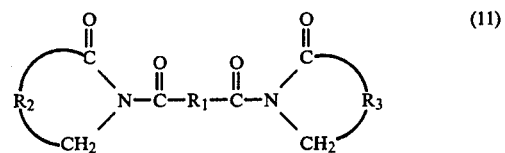

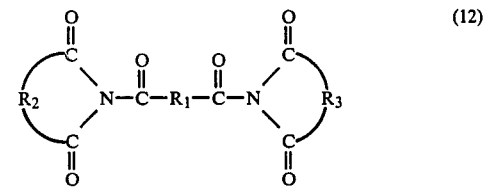

In the above general formulae (11) and (12), $R_1$ represents any of $C_2$–$C_{12}$ organic groups, and $R_2$ and $R_3$ each independently stands for any of $C_1$–$C_{11}$ aliphatic hydrocarbon or aromatic hydrocarbon groups.

Particularly preferred bis(N-acyllactam) compounds and bis(N-acylimide) compounds include terephthaloyl bis(N-caprolactam), isophthaloyl bis(N-caprolactam), adipoyl bis(N-caprolactam), azelayl bis(N-caprolactam), sebacoyl bis(N-caprolactam), terephthaloyl bis(N-pyrrolidone), isophthaloyl bis(N-pyrrolidone), adipoyl bis(N-succinimide), sebacoyl bis(N-succinimide), isophthaloyl bis(N-succinimide), and sebacoyl bis(N-phthalimide), etc.

Examples of bisbenzoxazinone compounds are those expressed by the general formula (13) below.

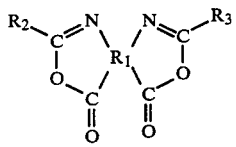

(13)

In the above general formula (13), $R_1$ is a tetravalent aromatic group, and $R_2$ and $R_3$ each independently represents a group selected from alkyl, aryl and cycloalkyl groups.

Paticularly preferred examples of bisbenzoxazinone compounds include: 2,8-dimethyl-4H, 6H-benzo[1,2-d:5,4-d']bis-[1,3]-oxazine-4,6-dione, 2,7-dimethyl-4H,9H-benzo[1,2-d:4,5-d']bis-[1,3]-oxazine-4,9-dione, 2,8-diphenyl-4H,6H-benzo[1,2-d:5,4-d']bis-[1,3]-oxazine-4,6-dione, 2,7-diphenyl-4H,9H-benzo[1,2-d:4,5-d']bis-[1,3]-oxazine-4,9-dione, 6,6'-bis(2-methyl-4H,3,1-benzoxazine-4-one), 6,6'-bis(2-ethyl-4H,3,1-benzoxazine-4-one), 6,6'-bis(2-phenyl-4H,3,1-benzoxazine-4-one), 6,6'-methylenebis(2-methyl-4H,3,1-benzoxazine-4-one), 6,6'-methylenebis(2-phenyl-4H,3,1-benzoxazine-4-one), 6,6'-ethylenebis(2-methyl-4H,3,1-benzoxazine-4-one), 6,6'-ethylenebis(2-phenyl-4H,3,1-benzoxazine-4-one), 6,6'-butylenebis(2-methyl-4H,3,1-benzoxazine-4-one), 6,6'-butylenebis(2-phenyl-4H,3,1-benzoxazine-4-one), 6,6'-oxybis(2-methyl-4H,3,1-benzoxazine-4-one), 6,6'-oxybis(2-phenyl-4H,3,1-benzoxazine-4-one), 6,6'-sulfonylbis(2-methyl-4H,3,1-benzoxazine-4-one), 6,6'-sulfonylbis(2-phenyl-4H,3,1-benzoxazine-4-one), 6,6'-carbonylbis(2-methyl-4H,3,1-benzoxazine-4-one), 6,6'-carbonylbis(2-phenyl-4H,3,1-benzoxazine-4-one), 7,7'-methylenebis(2-methyl-4H,3,1-benzoxazine-4-one), 7,7'-methylenebis(2-phenyl-4H,3,1-benzoxazine-4-one), 7,7'-bis(2-methyl-4H,3,1-benzoxazine-4-one), 7,7'-ethylenebis(2-methyl-4H,3,1-benzoxazine-4-one), 7,7'-oxybis(2-methyl-4H,3,1-benzoxazine-4-one), 7,7'-sulfonylbis(2-methyl-4H,3,1-benzoxazine-4-one), and 7,7'-carbonylbis(2-methyl-4H,3,1-benzoxazine-4-one), etc.

Examples of polyisocyanate compounds include: aromatic diisocyanate compounds such as 2,4-tolylenediisocyanate, 2,6-tolylenediisocyanate, xylylenediisocyanate, meta-xylylenediisocyanate, 4,4'-diphenylmethanediisocyanate and naphthylenediisocyanate, etc.; aliphatic diisocyanate compounds such as hexamethylenediisocyanate, trimethyl-hexamethylenediisocyanate, lysinediisocyanate and dimeric acid diisocyanate, etc.; alicyclic diisocyanate compounds such as isophoronediisocyanate, 4,4'-methylenebis(cyclohexylisocyanate), methylcyclohexane-2,4(or 2,6)diisocyanate and 1,3-(isocyanatemethyl)-cyclohexane, etc.; polyisocyanate compounds which are the reaction products of polyols with diisocyanates, such as the adduct of one mol of 1,3-butylene glycol with 2 mols of tolylenediisocyanate, that of one mol of trimethylolpropane with 3 mols of tolylenediisocyanate, etc.; diisocyanate polymers such as hexamethylene diisocyanate trimer, tolylenediisocyanate trimer, etc.; and blocked polyisocyanate compounds obtained by reacting the above polyisocyanate compounds with blocking agents (e.g., alcohols such as methanol, ethanol, propanol, etc.; phenols such as phenol, m-cresol, m-nitrophenol, etc.; lactams such as ε-caprolactam, 2-pyrrolidone, etc.; oximes such as acetoxime, methyl ethyl ketoxime, etc.; and active methylene compounds such as malonate, acetoacetate, etc.).

Examples of oxazolone compounds are those expressed by the general formula (14) below.

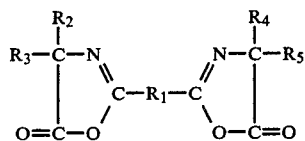

(14)

In the above general formula (14), $R_1$ represents an aliphatic or aromatic hydrocarbon group, and $R_2$, $R_3$, $R_4$ and $R_5$ each independently represents a hydrogen atom or an aliphatic or aromatic hydrocarbon group.

Particularly preferred oxazolone compounds include: 2,2'-p-phenylenebis[(4H)oxazolone-5], 2,2'-m-phenylenebis[(4H)oxazolone-5], 2,2'-p-phenylenebis[4-methyl(4H)oxazolone-5], 2,2'-m-phenylenebis[4-methyl(4H)oxazolone-5], 1,4-bis-2[4-methyl(4H)-5-oxazolonyl]cyclohexane, 1,2-bis-2[4-methyl(4H)-5-oxazolonyl]cyclohexane, 2,2'-tetramethylenebis[(4H)oxazolone-5], 2,2'-tetramethylenebis[4,4'-dimethyl(4H)oxazolone-5], 2,2'-dimethylenebis[4,4-dimethyl(4H)oxazolone-5], etc.

The reaction of the resin precursor with the chain extending agent can be performed under the identical conditions with those for the aforesaid reaction between the cyclic acid anhydride and the linear polyester.

The reaction ratio of the resin precursor with the chain extending agent is recommendably selected within the range that, per one equivalent of the hydroxyl groups in the resin precursor, there should be 0.2–1.5 equivalents, preferably 0.5–1.2 equivalents, of the functional groups reactable with said hydroxy groups. When the equivalent number of the functional groups in the chain extending agent per one equivalent of the hydroxyl groups in the resin precursor is less than 0.2, it is difficult to increase the molecular weight of the final resin to the level necessary for obtaining high photosensitivity. Whereas, when it exceeds 1.5, further increase in the molecular weight and photosensitivity of the final resin corresponding to the increased quantitative ratio of the chain extending agent cannot be expected, but rather a tendency for undesirable gelation is observed.

Catalyst may be present in the reaction system of the resin precursor with the chain extending agent. Usable catalysts include organometallic compounds such as dibutyltin oxide, dibutyltin dilaurate, tetra-n-butyl titanate, etc.; and tertiary amine and quaternary ammonium salts such as dimethylbenzylamine and trimethylbenzylammonium chloride, etc.

As the organic solvents useful for the reaction, those useful in the aforesaid reaction of linear polyesters with cyclic acid anhydrides may be used.

Through the processes as above, a photosensitive resin having the structural units of the general formula below,

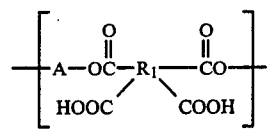

and an acid value of 15–215 can be obtained. The photosensitive resin having acid values within the above range are developable with aqueous alkaline developers.

Use of the photosensitive resins having acid values within the above is desirable for the preparation of photosensitive image-forming material of the present invention.

The image-forming material containing the above photosensitive resin in its photosensitive layer can be prepared by applying a solution of the photosensitive resin prepared as above in a suitable solvent, or a composition optionally further containing, besides that solution, other additives such as a sensitizer, pigment, dyestuff, filler, stabilizer, crosslinking agent and a plasticizer, etc., onto the surface of a support and drying the same. Convenient solvents differ depending on the composition and molecular weight of the resin, but normally the organic solvents useful for the above reaction; alcoholic solvents such as tetrahydrofurfuryl alcohol, benzyl alcohol, etc.; alcohol monoalkylethereal solvents such as glycol monomethyl ether, glycol monoethyl ether, etc.; and ethylene glycol monophenyl ether, may be used. The above solvents can be used either singly or in combination.

As the sensitizer, any of those conventionally used in this field can be used, which include benzophenone derivatives, benzanthrone derivatives, quinones, aromatic nitro compounds, naphthothiazoline derivatives, benzothiazoline derivatives, ketocoumarin compounds, pyrylium salts and thiapyrylium salts, etc. Specific examples of such sensitizers include Michler's ketone, diethylaminoethyl benzophenone, benzanthrone, (3-methyl-1,3-diaza-1,9-benz)anthrone picramide, 6,11-dichlorobenzanthrone, 6-phenyl-benzanthrone, 1,8-dimethoxyanthraquinone, 1,2-benzanthraquinone, 5-nitroacenaphthene, 2-nitrofluorene, 2,7-dinitrofluorene, 1-nitronaphthalene, 1,5-dinitronaphthalene, p-nitrodiphenyl, 2-dibenzoylmethylene-3-methylnaphthothiazoline, 2-benzoylmethylene-1-methylnaphthothiazoline, 2-bis(furoyl) methylene-3-methylbenzothiazoline, 2-benzoylmethylene-3-methylbenzothiazoline, 3,3'-carbonyl-bis(7-diethylaminocoumarin), 2,4,6-triphenylthiapyrylium perchlorate, 2,6-bis(p-ethoxyphenyl)-4-(p-n-amyloxyphenyl)-thiapyrylium perchlorate, etc.

The above photosensitive resin composition is applied to the support by any coating means such as whirler application, dipping, curtain application, roll application, spraying, air knife application, doctor knife application, spinner application, etc.

Specific examples of the support include metallic plate such as those of aluminium, zinc, copper, stainless steel, etc.; sheets or plates of synthetic resins such as polyethylene terephthalate, polycarbonate, cellulose derivatives, etc.; composite materials such as the paper melt applied with a synthetic resin or applied with a synthetic resin solution, or of the synthetic resin, onto which metallic layer is adhered with such techniques as vacuum evaporation coating, laminating, etc.; and silicone wafers, etc.

As the support of printing plate, plates of metals such as aluminium, copper, or zinc of which surfaces are roughened by mechanical, chemical, or electrochemical means, and on which the photosensitive layer of the thickness normally ranging 0.1–2.5 microns is formed.

The photosensitive layer of this printing plate is exposed with negative images, and after so curing and insolubilizing the exposed portions of the layer, the unexposed portions are dissolved and removed with an aqueous alkaline developer, to form the corresponding images on the support.

The aqueous alkaline developers used in the above procedure are those composed mainly of water, to which water-soluble inorganic compounds such as alkaline metal silicates, bicarbonates, carbonates or hydroxides, or amines are added, which may further contain organic solvents, surfactants, etc.

Suitable light source to be used for the exposure includes carbon arc lamp, mercury lamp, xenon lamp, metal halide lamp and laser, etc.

As so far stated, the photosensitive resin of this invention is extremely useful for the formation of photosensitive layer in printing plate. The utility of the photosensitive resin, however, is not limited thereto, but it can be also useful as photo-resist for various fine processings.

Hereinafter the present invention will be more specifically explained with reference to working examples, it being understood that the scope of the invention is in no way limited thereby, so long as the embodiments do not deviate from the gist of the present invention.

EXAMPLES 1–25

(1) Preparation of linear polyesters

Method A

The mixtures of the blend compositions specified in Table 1 were each charged in a reactor equipped with a stirrer, nitrogen gas inlet pipe, thermometer and a distillation pipe, together with the catalyst (dibutyltin oxide: 600 mg) and an inhibitor (phenothiazine: 60 mg), and the reaction was initiated when the system was heated to 190° C. under stirring in nitrogen gaseous atmosphere. The heating and stirring were continued for further 3.5 hours, while thoroughly distilling off the formed ethanol. Thus linear polyesters having the hydroxyl values as indicated in Table 1 were obtained.

Method B

The mixtures having the blend compositions as specified in Table 1 and the inhibitors (phenothiazine: 60 mg) were each charged in the reactor identical with that used in Method A, heated to 150° C. under stirring in nitrogen gaseous atmosphere, added with the catalyst (tetraisopropyl titanate: 200 mg), and reacted. Thereafter the temperature was raised to 220° C. consuming one hour. The heating and stirring were continued for further one hour at said temperature, while completely distilling off the formed ethanol. Thus the linear polyesters having the hydroxyl values as indicated in Table 1 were obtained.

(2) Preparation of photosensitive resins

Photosensitive resins were prepared by the methods (I) and (II) below.

Method (I)

Each of the linear polyesters obtained as above (100 g) was stirred under heating at 140° C., and to which the acid anhydride specified in Table 2 was added. Each system was stirred under normal pressure in nitrogen atmosphere, under the condition indicated in Table 2 (reaction time), to give a photosensitive resin having an acid value as indicated in Table 2.

Method (II)

The linear polyesters of the weights specified in Table 2 were stirred under heating at 140° C., added with the acid anhydrides specified in Table 2, and stirred for 2 hours under normal pressure in nitrogen atmosphere. Thus the resin precursors having the acid values and hydroxyl values as indicated in Table 3 were obtained. Subsequently, the photosensitive resins were prepared therefrom by either of Methods II-1, II-2, and II-3.

Method II-1

Two hundred (200)g of the resin precursor was charged in a reactor together with the chain extending agent specified in Table 3. The pressure inside the reactor was reduced to 1 mmHg, and under said pressure and the conditions indicated in Table 3 (temperature/hours), the system was stirred. Thereafter the pressure was raised to the atmospheric level, and the formed resin was withdrawn.

Method II-2

Two hundred (200)g of the resin precursor was charged in a reactor together with the chain extending agent specified in Table 3, and stirred under normal pressure in nitrogen gaseous atmosphere, under the conditions indicated also in Table 3 (temperature/hours). Thus formed resin was withdrawn.

Method II-3

Two hundred (200)g of the resin precursor was dissolved in 800 g of monochlorobenzene to form a 20 wt % solution, and to which the chain extending agent each specified in Table 3 was added. After continuing the stirring under the conditions specified in Table 3 (temperature/hours), the temperature in the reactor was dropped to the room temperature, and the resulting resin solution was withdrawn.

Through the above Methods II-1, II-2 and II-3, photosensitive resins having the acid values as specified in Table 3 were obtained.

(3) measurement of photosensitivity of the photosensitive image-forming material

(3)-1 Method of preparation of photosensitive plates

Each of the resins or resin solutions obtained in (2) above was diluted with cyclohexanone, into a 4 wt % solution, to which 5% by weight of 2-benzoylmethylene-1-methyl-β-naphthathiazoline and 10% by weight of a phthalocyanin pigment, both based on the weight of the resin, were added to form a photosensitive composition. The composition was applied with a whirler onto an aluminum plate which had been grained and anodized, and dried to provide a photosensitive plate having a photosensitive layer of approximately 1 μm in thickness.

(3)-2 Photosensitivity-measuring conditions

The photosensitive plate obtained in (3)-1 above was intimately contacted with a step wedge with the successive difference in level of 0.15 and exposed for 15 seconds with a metal halide lamp of 1 KW output ("Idlefin-1000", product of Iwasaki Electrical Co.) at a space of 1 m. Thereafter the photosensitive plate was developed with the developer of the composition below, and the maximum number of insolubilized steps was counted as the norm of photosensitivity.

|  | Composition of developer |
| --- | --- |
| Benzyl alcohol | 3.0 wt. % |
| Sodium carbonate | 1.0 wt. % |
| Pellex NBL* | 1.5 wt. % |
| Water | 94.5 wt. % |

*Pellex NBL ... Sodium tert.-butyl-naphthalenesulfonate-containing anionic surfactant preparated by Kao Atlas Co.

(4) Evaluation of printing durability and oleophilicity (ink receptivity) when the photosensitive image-forming material is used as the printing plate The photosensitive plate prepared by the similar method to (3) above was intimately contacted with a negative film of a test pattern, exposed using a metal halide lamp of 1 KW output ("Idlefin-1000", product of Iwasaki Electrical Co.) spaced by 1 m, for the time as would make the photosensitivity grade step 6, and developed with the same developer as used in (3) above to provide a printing plate. Thus prepared printing plate was mounted on a four-color lithographic press machine. The printing was performed under the conditions similar to those of actual lithographic printing, using a standard lithographic printing ink. After printing 50,000 sheets of papers, the printing durability and oleophilicity were evaluated. The printing durability was evaluated by the degree of reproducibility of the original images on the printed matters, without the occurrence of dot-thickening, print skip, etc. and the oleophilicity was evaluated by the degree of clarity of obtained images, without blurs or poor ink adhesion.

The contents and the results of foregoing examples are tabulated in Tables 1 through 3.

TABLE 1

|  |  | (a) | (b) | (c) | (d) | (e) | (f) | (g) | (h) | (i) | (j) |
| --- | --- | --- | --- | --- | --- | --- | --- | --- | --- | --- | --- |
| Starting material of linear polyester | Diethyl p-phenylenediacrylate (g) | 54.8 (0.2 mol) | 54.8 (0.2 mol) | 54.8 (0.2 mol) | 54.8 (0.2 mol) | 54.8 (0.2 mol) |  | 54.8 (0.2 mol) | 54.8 (0.2 mol) | 54.8 (0.2 mol) |  |
|  | Diethyl 2-nitro-p-phenylenediacrylate (g) |  |  |  |  |  | 63.8 (0.2 mol) |  |  |  | 63.8 (0.1 mol) |
|  | Bisphenol A (1 mol)-ethylene oxide (6.2 mols) adduct (g) | 133.2 (0.266 mol) | 120.2 (0.24 mol) | 150.4 (0.3 mol) |  |  | 133.2 (0.266 mol) | 110.2 (0.22 mol) |  | 100.2 (0.2 mol) | 150.4 (0.3 mol) |
|  | Bisphenol A (1 mol)- |  |  |  | 133.6 |  |  |  |  | 19.6 |  |

TABLE 1-continued

|  | | (a) | (b) | (c) | (d) | (e) | (f) | (g) | (h) | (i) | (j) |
|---|---|---|---|---|---|---|---|---|---|---|---|
| | ethylene oxide (10 mols) adduct (g) | | | | (0.2 mol) | | | | | (0.1 mol) | |
| | Tricyclodecanedi-methanol (g) | | | | 13 (0.066 mol) | | | | | | |
| | 1,4-Di-β-hydroxy-ethoxycyclohexane (g) | | | | | 54.2 (0.266 mol) | | | 81.6 (0.4 mol) | | |
| Linear polyester | Method of preparation | A | A | A | A | B | A | B | A | A | A |
| | Hydroxyl value | 46.5 | 29.3 | 61.8 | 42.2 | 83.8 | 43.1 | 14.8 | 194.1 | 71.5 | 58.4 |

TABLE 2

(Method I)

| | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Linear polyester | type | (a) | (a) | (a) | (b) | (c) | (d) | (e) | (f) | (g) | (h) |
| | Amount (g) | 100 | 100 | 100 | 100 | 100 | 100 | 100 | 100 | 100 | 100 |
| Acid anhydride | Pyromellitic dianhydride | 9.0 g (1.0) | 7.7 g (0.85) | 10.8 g (1.2) | 5.7 g (1.0) | 12.0 g (1.0) | | | 8.4 g (1.0) | 2.9 g (1.0) | 50.2 g (1.33) |
| | 3,3',4,4'-benzo-phenonetetra-carboxylic dianhydride | | | | | | 12.1 g (1.0) | | | | |
| | 1,2,3,4-cyclo-pentanetetra-carboxylic dianhydride | | | | | | | 15.7 g (1.0) | | | |
| Conditions (reaction time) | | 20 min. | 30 min. | 20 min. | 10 min. | 30 min. | 20 min. | 135 min. | 20 min. | 10 min. | 30 min. |
| Photosensitive resin | Acid value | 43.5 | 36.5 | 59.5 | 26.8 | 56.8 | 37.1 | 71.8 | 41.5 | 15.4 | 214.5 |
| | Photosensitivity | 10 | 8 | 9 | 11 | 8 | 9 | 7 | 8 | 10 | 5 |
| Developability | | Good | Good | Good | Good | Good | Good | Good | Good | Good | Good |
| Printing plate | Printing durability | Good | Good | Good | Good | Good | Good | Good | Good | Good | Good |
| | Ink receptivity | Good | Good | Good | Good | Good | Good | Good | Good | Good | Good |

The numerical values within the parentheses in the column of acid anhydride give the equivalent numbers of acid anhydride groups per one equivalent of hydroxyl groups in linear polyester.

TABLE 3

(Method II)

| | | Ex. 11 | Ex. 12 | Ex. 13 | Ex. 14 | Ex. 15 | Ex. 16 | Ex. 17 | Ex. 18 |
|---|---|---|---|---|---|---|---|---|---|
| Linear polyester | Type | (c) | (c) | (c) | (c) | (b) | (h) | (i) | (c) |
| | Amount (g) | 180 | 180 | 180 | 30 | 30 | 30 | 30 | 30 |
| Acid*1 anhydride | Pyromellitic dianhydride | 10.8 g (0.5) | 10.8 g (0.5) | 10.8 g (0.5) | 2.70 g (0.75) | 1.14 g (0.67) | 9.39 g (0.83) | 2.08 g (0.5) | |
| | 1,2,3,4-Cyclopentanetetra-carboxylic dianhydride | | | | | | | | 1.73 g (0.5) |
| Resin precursor | Acid value | 29.5 | 29.5 | 29.5 | 41.9 | 17.9 | 134.1 | 33.5 | 29.8 |
| | Hydroxyl value | 28.8 | 28.8 | 28.8 | 15.0 | 10.1 | 24.0 | 33.2 | 28.6 |
| Chain extending agent | 4,4'-Diphenylmethanediisocyanate | 12.8 | 10.2 | 15.4 | 6.6 | 4.6 | 10.6 | | |
| | Isophoronediisocyanate | | | | | | | 13.2 | |
| | Diphenyl terephthalate | | | | | | | | 16.2 |
| | Diphenyl carbonate | | | | | | | | |
| | Diphenyl oxalate | | | | | | | | |
| | Terephthaloyl bis(N—caprolactam) | | | | | | | | |
| | Adipoyl bis(N—succinimide) | | | | | | | | |
| | 6,6'-Methylenebis(2-methyl-4H,3,1-benzoxazine-4-one) | | | | | | | | |
| | 2,2'-p-Phenylenebis[4-methyl-(4H)oxazolone-5] | | | | | | | | |
| | Equivalent number of functional group*2 | 1.0 | 0.8 | 1.2 | 1.0 | 1.0 | 1.0 | 1.0 | 1.0 |
| Preparation of photosensitive resin | Method | II-(3) | II-(3) | II-(3) | II-(3) | II-(3) | II-(3) | II-(3) | II-(1) |
| | Conditions (temp./time) | 60° C./ 3 hr. | 60° C./ 3 hr. | 60° C./ 3 hr. | 60° C./ 3 hr. | 60° C./ 3 hr. | 60° C./ 3 hr. | 60° C./ 3 hr. | 180° C./ 1 hr. |
| Photosensitive resin | Acid value | 32.2 | 28.3 | 27.5 | 41.1 | 18.0 | 126.9 | 31.2 | 28.6 |
| | Photosensitivity | 9 | 8 | 9 | 10 | 9 | 6 | 8 | 8 |
| Developability | | Good | '' | '' | '' | '' | '' | '' | '' |
| Printing plate | Printing durability | '' | '' | '' | '' | '' | '' | '' | '' |
| | Ink receptivity | '' | '' | '' | '' | '' | '' | '' | '' |

Example

TABLE 3-continued (Method II)

| | | Ex. 19 | Ex. 20 | Ex. 21 | Ex. 22 | Ex. 23 | Ex. 24 | Ex. 25 |
|---|---|---|---|---|---|---|---|---|
| Linear polyester | Type | (h) | (j) | (c) | (c) | (c) | (c) | (c) |
| | Amount (g) | 30 | 30 | 180 | 180 | 180 | 180 | 180 |
| Acid*¹ anhydride | Pyromellitic dianhydride | 5.66 g (0.5) | 1.70 g (0.5) | 10.8 g (0.5) | 10.8 g (0.5) | 10.8 g (0.5) | 10.8 g (0.5) | 10.8 g (0.5) |
| | 1,2,3,4-Cyclopentanetetra-carboxylic dianhydride | | | | | | | |
| Resin precursor | Acid value | 82.1 | 27.5 | 29.5 | 29.5 | 29.5 | 29.5 | 29.5 |
| | Hydroxyl value | 81.5 | 27.5 | 28.8 | 28.8 | 28.8 | 28.8 | 28.8 |
| Chain extending agent | 4,4'-Diphenylmethanediisocyanate | | | | | | | |
| | Isophoronediisocyanate | | | | | | | |
| | Diphenyl terephthalate | | | | | | | |
| | Diphenyl carbonate | 31.0 | | | | | | |
| | Diphenyl oxalate | | 11.8 | | | | | |
| | Terephthaloyl bis(N—caprolactam) | | | 18.2 | | | | |
| | Adipoyl bis(N—succinimide) | | | | 15.8 | | | |
| | 6,6'-Methylenebis(2-methyl-4H,3,1-benzoxazine-4-one) | | | | | 17.2 | | |
| | 2,2'-p-Phenylenebis[4-methyl-(4H)oxazolone-5] | | | | | | 14.0 | 14.0 |
| | Equivalent number of functional groups*² | 1.0 | 1.0 | 1.0 | 1.0 | 1.0 | 1.0 | 1.0 |
| Preparation of photosensitive resin | Method | II-(1) | II-(1) | II-(1) | II-(1) | II-(2) | II-(3) | II-(2) |
| | Conditions (temp./time) | 180° C./ 1.5 hr. | 180° C./ 1 hr. | 180° C./ 0.5 hr. | 180° C./ 1 hr. | 180° C./ 3 hr. | 140° C./ 4 hr. | 140° C./ 5 hr. |
| Photosensitive resin | Acid value | 81.1 | 27.5 | 28.8 | 29.3 | 28.0 | 27.2 | 26.8 |
| | Photo-sensitivity | 7 | 8 | 9 | 8 | 8 | 9 | 10 |
| Developability | | Good | Good | Good | Good | Good | Good | Good |
| Printing plate | Printing durability | " | " | " | " | " | " | " |
| | Ink receptivity | " | " | " | " | " | " | " |

*¹The numerical numbers in the parentheses in the column of acid anhydride give the equivalent numbers of acid anhydride groups per one equivalent of hydroxyl groups in linear polyester.
*²The equivalent number of functional groups is that in the chain extending agent per one equivalent of hydroxyl groups in the resin precursor.

We claim:

1. A photosensitive image-forming material developable with aqueous alkali developers comprising a support and a photosensitive layer on said support, which is characterized in that a photosensitive resin having the structural units represented by the general formula

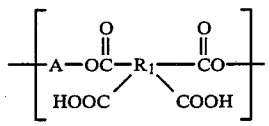

[I]

(wherein A represents a linear polyester structural unit containing in its main chain a dicarboxylic acid unit having a photosensitive, unsaturated double bond adjacent to the aromatic ring, and a glycol unit containing an alicyclic ring structure or an aromatic ring structure, and $R_1$ represents a tetravalent organic group) is contained in the photosensitive layer.

2. The image-forming material of claim 1, wherein the photosensitive resin has an acid value of at least 15.

3. The image-forming material of claim 1 or 2, wherein $R_1$ represents a carboxyl residue of an aromatic tetracarboxylic acid.

4. The image-forming material of claim 1 or 2, whrerin $R_1$ represents a carboxyl residue of an alicyclic tetracarboxylic acid.

5. The image-forming material of claim 1 or 2, wherein $R_1$ reppresents a carboxyl residue of an aliphatic tetracarboxylic acid.

6. The image-forming material of any of claims 1 or 2 wherein the dicarboxylic acid unit having the photosensitive, unsaturated double bond adjacent to the aromatic ring is any one of those expressed by the general formulae below:

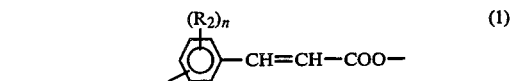  (1)

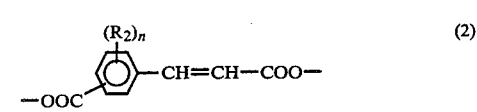  (2)

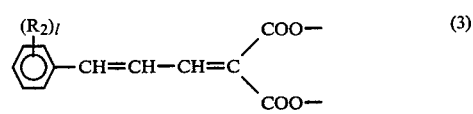  (3)

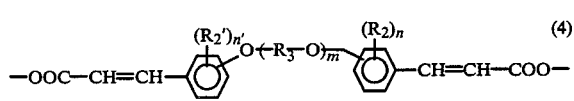  (4)

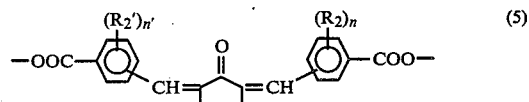  (5)

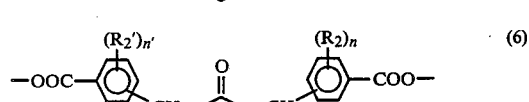  (6)

and

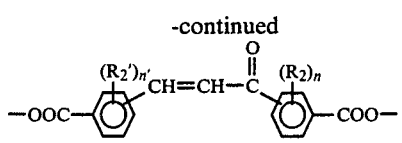

(in the above eneral formula (1) through (7), $R_2$ and $R_2'$ are each independently selected from the group consisting of hydrogen atom, $C_1$-$C_4$ alkyl groups, $C_1$-$C_4$ alkoxy groups, halogen atoms and nitro group; $R_3$ is selected from $C_2$-$C_4$ alkylene groups; l is an integer of 1-5; n and n' each independently represents an integer of 1-4; and m represents an integer of 1-5).

7. The image-forming material of any of claims 1 or 2, in which the content of the dicarboxylic acid units having the photosensitive, unsaturated double bond adjacent to the aromatic ring is 30–100 mol % based on the total dicarboxylic acid units in the linear polyester structural unit A.

8. The image-forming material of claim 1, in which the photosensitive resin is that obtained by reacting the polyester containing the structural units expressed by the general formula [I] and hydroxyl groups with a compound having in its molecule at least two functional groups reactable with the hydroxyl groups.

9. The image-forming material of claim 8, wherein the compound having in its molecule at least two functional groups reactable with the hydroxyl groups is selected from the group consisting of compounds containing in their molecules at least two aryl ester groups, aryl carbonate groups, N-acyl-lactam groups, N-acylimide groups, benzoxazinone groups, isocyanate groups, oxazolonyl groups, N-acylimidazole groups, silanol groups, furoxane groups, aziridine groups, isothiocyanate groups, vinyl ether groups, keteneacetal groups, unsaturated cycloacetal groups or carbodiimide groups.

10. The image-forming material of claim 8 or 9, wherein the compound having in its molecule at least two functional groups reactable with the hydroxyl groups is at least one compound selected from the group consisting of diaryl oxalate compounds, diaryl phthalate compounds, diaryl carbonate compounds, bis(N-acyl-lactam) compounds, bis(N-acylimide) compounds, bis-benzoxazinone compounds, polyisocyanate compounds, bis-oxazolone compounds, bis(N-acylimidazole) compounds, alkoxysilane compounds., silanol compounds, furoxane compounds, bis-aziridine compounds, polyisothiocyanate compounds, divinylether compounds, diketeneacetal compounds, unsaturated cycloacetal compounds and bis-carbodiimide compounds.

11. The image-forming material of claim 1 in which the photosensitive layer is applied onto a support having a roughened metal surface.

12. The image-forming material of claim 6 wherein $R_1$ represents a carboxyl residue of an aromatic tetracarboxylic acid, an alicyclic tetracarboxylic acid or an aliphatic tetracarboxylic acid.

13. The image-forming material of claim 6 in which the content of the dicarboxylic acid units having the photosensitive unsaturated double bond adjacent to the aromatic ring is 30–100 mole % based on total dicarboxylic acid units in the linear polyester structural unit A.

14. The image-forming material of claim 2 wherein the photosensitive resin has an acid value of from 15 to 215.

15. The image-forming material of claim 6 wherein the glycol unit is derived from 1,4-bis-β-hydroxyethoxy cyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, or propylene oxide adduct of hydrogenated bisphenol A.

16. The image-forming material of claim 1 wherein A represents a linear polyester structural unit derived from a linear polyester which is the reaction product of diethyl p-phenylene diacrylate or diethyl 2-nitro-p-phenylene diacrylate with bisphenol A-ethylene oxide adduct, tricyclodecane dimethanol or 1,4-di-β-hydroxyethoxycyclohexane.

17. The image-forming material of claim 16 wherein the photosensitive resin having the structural units represented by the general formula I is the reaction product of said linear polyester with an acid anhydride selected from the group consisting of pyromellitic dianhydride, 3,3',4,4'-benzophenonetetracarboxylic dianhydride, and 1,2,3,4-cyclopentanetetracarboxylic dianhydride.

18. A photosensitive composition useful as an image-forming material developable with aqueous alkali developer which comprises a photosensitive resin hving the structural units represented by the general formula

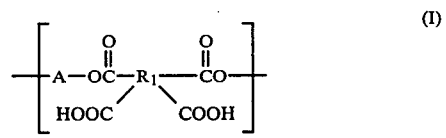

wherein A represents a linear polyester structural unit containing in its main chain a dicarboxylic acid unit having a photosensitve, unsaturated double bond adjacent to the aromatic ring, and a glycol unit containing an alicyclic ring structure or an aromatic ring structure, and $R_1$ represents a tetravalent organic group.

19. A printing plate comprising a support having a roughened metal surface and a photosensitive layer having a thickness in the range of from about 0.1 to 2.5 microns formed on said roughened metal surface, said photosensitive layer being soluble in aqueous alkali solvent and comprising a photosensitive resin having the structural units represented by the general formula

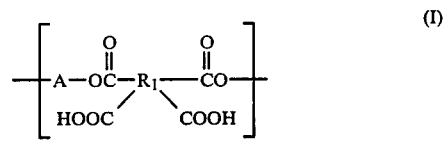

wherein A represents a linear polyester structural unit containing in its main chain a dicarboxylic acid unit having a photosensitive, unsaturated double bond adjacent to the aromatic ring, and a glycol unit containing an alicyclic ring structure or an aromatic ring structure, and $R_1$ represents a tetravalent organic group, and a sensitizer for promoting the radiation-sensitivity of the photosensitive resin.

20. The photosensitive composition of claim 18 further comprising one or more additives selected from the group consisting of sensitizers for promoting the radiation-sensitivity of the photosensitive resin, pigments, dyestuffs, fillers, stabilizers, cross-linking agents and plasticizers.

* * * * *

UNITED STATES PATENT AND TRADEMARK OFFICE
CERTIFICATE OF CORRECTION

PATENT NO. : 4,640,887
DATED     : February 3, 1987
INVENTOR(S) : CHIAKI NAKAMURA, ET AL.

It is certified that error appears in the above-identified patent and that said Letters Patent is hereby corrected as shown below:

IN THE CLAIMS

Claim 4, line 2, (column 15, line 61),
   delete "whrerin", insert --wherein--.

Claim 5, line 2, (column 15, line 64),
   delete "reppresents", insert --represents--.

Claim 6, line 14, (column 17, line 7),
   delete "eneral", insert --general--.

Claim 18, line 3, (column 18, line 25),
   delete "hving", insert --having--.

Signed and Sealed this

Thirteenth Day of October, 1987

Attest:

DONALD J. QUIGG

Attesting Officer

Commissioner of Patents and Trademarks